US010897270B2

(12) United States Patent
Wu

(10) Patent No.: US 10,897,270 B2
(45) Date of Patent: Jan. 19, 2021

(54) DYNAMIC DICTIONARY-BASED DATA SYMBOL ENCODING

(71) Applicant: Yingquan Wu, Palo Alto, CA (US)

(72) Inventor: Yingquan Wu, Palo Alto, CA (US)

(*) Notice: Subject to any disclaimer, the term of this patent is extended or adjusted under 35 U.S.C. 154(b) by 0 days.

(21) Appl. No.: 16/247,357

(22) Filed: Jan. 14, 2019

(65) Prior Publication Data

US 2019/0379393 A1 Dec. 12, 2019

Related U.S. Application Data

(60) Provisional application No. 62/681,583, filed on Jun. 6, 2018.

(51) Int. Cl.
| | | |
|---|---|---|
| H03M 7/00 | (2006.01) | |
| H03M 7/30 | (2006.01) | |
| H03M 7/42 | (2006.01) | |

(52) U.S. Cl.
CPC ........... H03M 7/3088 (2013.01); H03M 7/42 (2013.01)

(58) Field of Classification Search
CPC ...... H03M 13/1165; H03M 7/30; H03M 7/40; H03M 7/3088; H03M 7/42; H03M 13/618
USPC ...................... 341/51, 65, 67, 196, 106, 107
See application file for complete search history.

(56) References Cited

U.S. PATENT DOCUMENTS

| 4,122,440 | A | 10/1978 | Langdon, Jr. et al. | |
|---|---|---|---|---|
| 4,652,856 | A | 3/1987 | Mohiuddin et al. | |
| 5,872,530 | A * | 2/1999 | Domyo | H03M 7/3088 341/106 |
| RE41,152 | E | 2/2010 | Reynar et al. | |
| 9,214,954 | B2 * | 12/2015 | Ogasawara | H03M 7/3084 |
| 9,628,111 | B2 | 4/2017 | Henry et al. | |
| 2003/0112161 | A1 * | 6/2003 | Malik | H03M 7/30 341/51 |
| 2006/0181439 | A1 | 8/2006 | Varanasi | |
| 2011/0043387 | A1 * | 2/2011 | Abali | H03M 7/3088 341/51 |
| 2013/0311722 | A1 | 11/2013 | Arelakis et al. | |
| 2013/0318051 | A1 | 11/2013 | Kumar | |

(Continued)

OTHER PUBLICATIONS

Introduction to the EMC XtremIO Storage Array, White paper by Dell EMC Technologies, May 2015. Available: https://www.emc.com/collateral/white-papers/h11752-intro-to-XtremIO-array-wp.pdf.

(Continued)

*Primary Examiner* — Linh V Nguyen
(74) *Attorney, Agent, or Firm* — Nwamu, P.C.

(57) ABSTRACT

A dynamic dictionary-based data symbol encoder. A dynamic dictionary data structure is populated with evictable dictionary entries. The evictable dictionary entries are encoded with a dictionary index that is shorter than an original representation of the input symbols. A reference count evicts dictionary indices when eligible for eviction. Through building a dynamic symbol dictionary which is much smaller than (global) alphabet size, locally repetitive symbols can be effectively compressed using dictionary. The dictionary is also dynamically built along with the compression/decompression process and therefore does not carry overhead. However, tables/trees might be appended to enable entropy decoding. The method is also readily combined with the popular LZ77 and its variant encoding methods into composite one-pass encoding algorithms to achieve superior performance.

13 Claims, 8 Drawing Sheets

(56) References Cited

U.S. PATENT DOCUMENTS

| | | | |
|---|---|---|---|
| 2014/0139858 A1* | 5/2014 | Shiraishi | H04N 1/64 358/1.13 |
| 2016/0226511 A1* | 8/2016 | Kataoka | H03M 7/3084 |
| 2017/0019126 A1* | 1/2017 | Kataoka | H03M 7/3086 |
| 2017/0031964 A1 | 2/2017 | Sharique et al. | |
| 2018/0336178 A1* | 11/2018 | Kataoka | G06F 16/313 |
| 2019/0280710 A1* | 9/2019 | Tamir | H03M 7/40 |

OTHER PUBLICATIONS https://www.purestorage.com/products/purity/flash-reduce.html, Pure Storage Corp.

Data Deduplication Background: A Technical White Paper, Quantum Corp., 1999. Available: https://iq.quantum.com/?exLink.asp?66681210P41V56I29836713.

L. DuBois and M. Amaldas, "Key considerations as dedupation evolves into primary storage," IDC white paper, May 2010. Available: https://www.netapp.com/us/media/wp-key-considerations-deduplication-evolves-into-primary-storage.pdf.

S. Quinlan and S. Dorward, "Venti: A new approach to archival storage," Proc. USENIX on File and Storage Technologies (FAST), pp. 1-13, Jan. 2002.

B. Zhu, K. Li, and R.H. Patterson, "Avoiding the disk bottleneck in the data domain deduplication tile system," Proc. 6th USENIX on File and Storage Technologies (FAST), vol. 8, pp. 1-14, Feb. 2008.

A. Muthitacharoen, B. Chen, and D. Mazieres, "A low-bandwidth network tile system," Proc. ACM Symp. Oper. Syst. Principles, pp. 1-14, Oct. 2001.

P. Shilane, M. Huang, G. Wallace, and W. Hsu, "WAN optimized replication of backup datasets using stream-informed delta compression," Proc. 10th USENIX on File and Storage Technologies (FAST), pp. 49-64, Feb. 2012.

Y. Hua, X. Liu and D. Feng, "Cost-efficient remote backup services for enterprise clouds," IEEE Trans. Industrial Informatics, vol. 12, No. 5, pp. 1650-1657, 2016.

National Institute of Standards and Technology, FIPS 180-4. Secure Hash Standard US Dept. of Commerce, Aug. 2015. Available: https://nvlpubs.nist.gov/nistpubs/FIPS/NIST. FIPS.180-4.pdf.

M.O. Rabin, "Fingerprinting by random polynomials," Cntr. Res. Comput. Tech., Aiken Comput. Lab., 1981.

U. Manber, "Finding similar files in a large file system," Technical Report TR 93-33, Department of Computer Science, University of Arizona, Oct. 1993, also in Proc. USENIX Winter Technical Conf., pp. 17-21. 1994.

K. Eshghi and H.K. Tang, "A framework for analyzing and improving content-based chunking algorithms," Hewlett Packard Lab., Palo Alto, CA, USA, Tech. Rep. HPL-2005-30(R.1), 2005.

N. Bjorner, A. Blass, and Y. Gurevich, "Content-dependent chunking for differential compression, the local maximum approach," Journal of Computer and System Sciences, vol. 76, No. 3, pp. 154-203, 2010.

F. Douglis and A. Iyengar, "Application-specific delta-encoding via resemblance detection," in Proc. USENIX Annu. Tech. Conf. Gen. Track, pp. 113126, Jun. 2003.

A. Broder, "Identifying and filtering near-duplicate documents," in Proc. Combinatorial Pattern Matching, pp. 110, Jun. 2000.

P. Kulkarni, F. Douglis, J.D. LaVoie, and J.M. Tracey, "redundancy elimination within large collections of files," Proc. USENIX Annu. Tech. Conf., pp. 59-72, Jun. 2004.

A. Z. Broder, On the resemblance and containment of documents, in Proc. Compress. Complexity Sequences, pp. 2129, Jun. 1997.

W. Xia, H. Jiang, D. Feng, and L. Tian, "Combining deduplicaiton and delta copression to achieve low-overhead data reduction on backup datasets," in Proc. IEEE Data Compression Conf. pp. 203212, Mar. 2014.

W. Xia, H. Jiang, D. Feng, and L. Tian, "DARE: A deduplicaiton-aware resemblance detection and elimination scheme for data reduction with low overheads," IEEE Trans. Computers, vol. 65, No. 6, pp. 1692-1705, 2016.

W. Xia, H. Jiang, D. Feng, F. Douglis, P. Shilane, Y. Hua, M. Fu, Y. Zhang, and Y. Zhou, "A comprehensive study of the past, present, and future of data deduplication," Proceedings of the IEEE, vol. 104, No. 9, pp. 1681-1710, Sep. 2016.

J. Ziv and A. Lempel, "A universal algorithm for sequential data compression," IEEE Trans. Inf. Theory, vol. 23, No. 3, pp. 337-343, 1977.

M Oberhumer, "LZO real-time data compression library," User manual for LZO version 0.28, Feb. 1997. Available: http://www.infosys.tuwien.ac.at/Staff/lux/marco/lzo.html.

L.P. Deutsch, "DEFLATE compressed data format specification version 1.3" RFC Editor, 1996. Available: http://tools.ietf.org/html/rfc1951.

J. Storer, et al, Data Compression via Textual Substituion, J. of Assoc. for Computing Machinery, vol. 19, No. 4, Oct. 1982, pp. 928-951.

Jarek Duda, et al., The Use of Asymmetric Numeral Systems as an Accurate Replacement for Huffman Coding, 978-1-4799-7783-3/15/$31.00, PCS 2015, pp. 65-69.

D.A. Huffman, A Method for the Construction of Minimum-Redundancy Codes*, Proc. of the I.R.E., pp. 1098-1101.

R.Hashemian, Life Member, IEEE, Condensed Huffman Coding, a New Efficient Decoding Technique, IEEE, 0-7803-7523-8, pp. I-228-I-231.

Reza Hashemian, Senior Member, IEEE, Direct Huffman Coding and Decoding Using the Table of Code-Lengths, Proc. of the International Conf. on Info. Tech.: Computers and Communications (ITCC'03), 0-7695-1916.

Harold Stone, A Logic-in-Memory Computer, IEEE Trans. on Computers, Jan. 1970, pp. 73-78.

K.R. Kaplan, et al., Cache-based Computer Systems, Computer, vol. 6, No. 3, pp. 30-36, 1973.

J. Ziv and A. Lempel, A Universal Algorithm for Sequential Data Compression, IEEE Trans. on Info. Theory, vol. 23, No. 3, pp. 337-343, May 1977.

Jacob Ziv, et al., Compression of Individual Sequences via Variable-Rate Coding, IEEE Trans. on Info. Theory, vol. IT-24, No. 5, Sep. 1978, pp. 530-536.

I. Witten, et al., Arithmetic Coding for Data Compression, Computing Practices, Communications of the ACM, vol. 30, No. 6, Jun. 1987, pp. 520-540.

Yingquan Wu, A Burst Encoding Method for Chunk-Based Data Deduplication Systems, May 22, 2018.

Brad Nisbet, et al., White Paper: Enterprise Storage: The Foundation for Application and Data Availability, Dec. 2010.

International Search Report and Written Opinion, dated Jul. 22, 2019, App. No. PCTUS2019/30284.

* cited by examiner

DYNAMIC DICTIONARY-BASED DATA SYMBOL ENCODING

BACKGROUND OF THE INVENTION

The present disclosure relates generally to data compression systems and methods and more specifically to data compression systems and methods that facilitate symbol encoding using a dynamic dictionary.

Entropy encoding is a lossless data compression scheme that involves a two-step process. The first pass computes symbol weights which are equivalent to probability distribution, and the second pass performs sequential encoding.

One type of entropy encoding creates and assigns a unique prefix-free code to each unique symbol that occurs in the input. These entropy encoders then compress data by replacing each fixed-length input symbol with the corresponding variable length prefix-free output codeword. Examples of entropy encoding techniques are Huffman coding and arithmetic coding.

Huffman coding uses a specific method for choosing the representation for each symbol, resulting in a prefix code. (These are sometimes called "prefix-free codes" because the bit string representing some particular symbol is never a prefix of the bit string representing any other symbol). Specifically, Huffman code uses pre-fix free codes based on a tree to encode symbols. Some Huffman codes may result in code words that are longer than the original size (while their overall average size is smaller). Arithmetic coding differs from other forms of entropy encoding such as Huffman coding in that rather than separating the input into component symbols and replacing each with a code, arithmetic coding encodes the entire message into a single number, an arbitrary-precision fraction q where $0.0 \leq q < 1.0$.

It is within the aforementioned context that a need for the present disclosure has arisen. Thus, there is a need to address one or more of the foregoing disadvantages of conventional systems and methods, and the present disclosure meets this need.

BRIEF SUMMARY OF THE INVENTION

Various aspects of dynamic dictionary-based data symbol encoding can be found in exemplary implementations of the present disclosure.

In one aspect, a dictionary data structure is dynamically generated during encoding. The dynamic dictionary receives input symbols from a data stream for encoding. Based on the received input symbols, the dynamic dictionary is populated with evictable dictionary entries. Here, the evictable dictionary entries might include a first and a second evictable dictionary entry. Each evictable dictionary entry may be encoded with a dictionary index that is shorter than an original representation of the input symbols.

In one example implementation, the evictable dictionary entries may be associated with a reference count. The reference count may be set to a minimum and maximum limit prior to or contemporaneously with encoding. In another example implementation, a cyclic pointer may rotate from one evictable dictionary entry to the other. The cyclic pointer in conjunction with the reference count may evict an evictable dictionary from the dynamic dictionary and replace it with another evictable dictionary entry. In another example implementation, the encoded data stream may include an indicator that indicates whether the symbol following the indicator bit is encoded or unencoded.

Through building a dynamic symbol dictionary which is much smaller than (global) alphabet size, locally repetitive symbols can be effectively compressed using a dictionary. Since the dictionary is dynamically built along with the compression/decompression process, no overhead is carried. The present disclosure is also readily combined with the popular LZ77 and its variants to provide composite one-pass encoding.

A further understanding of the nature and advantages of the present disclosure herein may be realized by reference to the remaining portions of the specification and the attached drawings. Further features and advantages of the present disclosure, as well as the structure and operation of various embodiments of the present disclosure, are described in detail below with respect to the accompanying drawings. In the drawings, the same reference numbers indicate identical or functionally similar elements.

DETAILED DESCRIPTION OF THE INVENTION

Reference will now be made in detail to the embodiments of the disclosure, examples of which are illustrated in the accompanying drawings. While the disclosure will be described in conjunction with various embodiments, it will be understood that they are not intended to limit the disclosure to these embodiments. On the contrary, the disclosure is intended to cover alternatives, modifications and equivalents which may be included within the spirit and scope of the disclosure as defined by the appended claims. Furthermore, in the following detailed description of the present disclosure, numerous specific details are set forth to provide a thorough understanding of the present disclosure. However, it will be obvious to one of ordinary skill in the art that the present disclosure may be practiced without these specific details. In other instances, well-known methods, procedures, components, and circuits have not been described in detail as to not unnecessarily obscure aspects of the present disclosure.

Dictionary-Based Symbol Encoding

In a standard context, each symbol might be represented by 8 bits. In this example, a local dictionary of size 32 is deployed where each entry is represented by d=5 bits. Further, in this example, an indicator bit 0 is used, followed by a regular symbol, and 1 to be followed by a dictionary entry. If the fraction a of symbols is represented by dictionary entry, then the average bits can be represented by $1+8(1-a)+5a=9-3a$ To achieve smaller data size, the fraction of dictionary reference must be greater than ⅓, i.e., a>⅓. Often, d=5 or 6 maximizes compression. For a statically distributed context, entropy encoding is optimal. However, when a context is non-statically distributed, the dictionary-based encoding of the present disclosure may surpass entropy encoding.

A special context composed of $$\{s_1(a,b), s_2(c,d), s_3(e,f), \ldots, s_{13}(y,z)\}$$

where $s_i(X, Y)$ is a one-million-long random string with equal number of Xs and Ys. In Huffman encoding, the first 6 letters are expressed in 4 bits whereas the remaining 20 letters are expressed in 5 bits. Thus, the average number of bits is $(6\times4+20\times5)/26=124/26=4.77$ bits, while arithmetic coding effectively achieves entropy of $\log_2 26=4.70$ bits.

On the other hand, in one example, the present dictionary-based encoding uses 2 bits (1-bit dictionary indicator plus 1-bit dictionary index) by using 1-bit dictionary. Here, symbols are defined in a small space, [0, 255].

Figure 1:
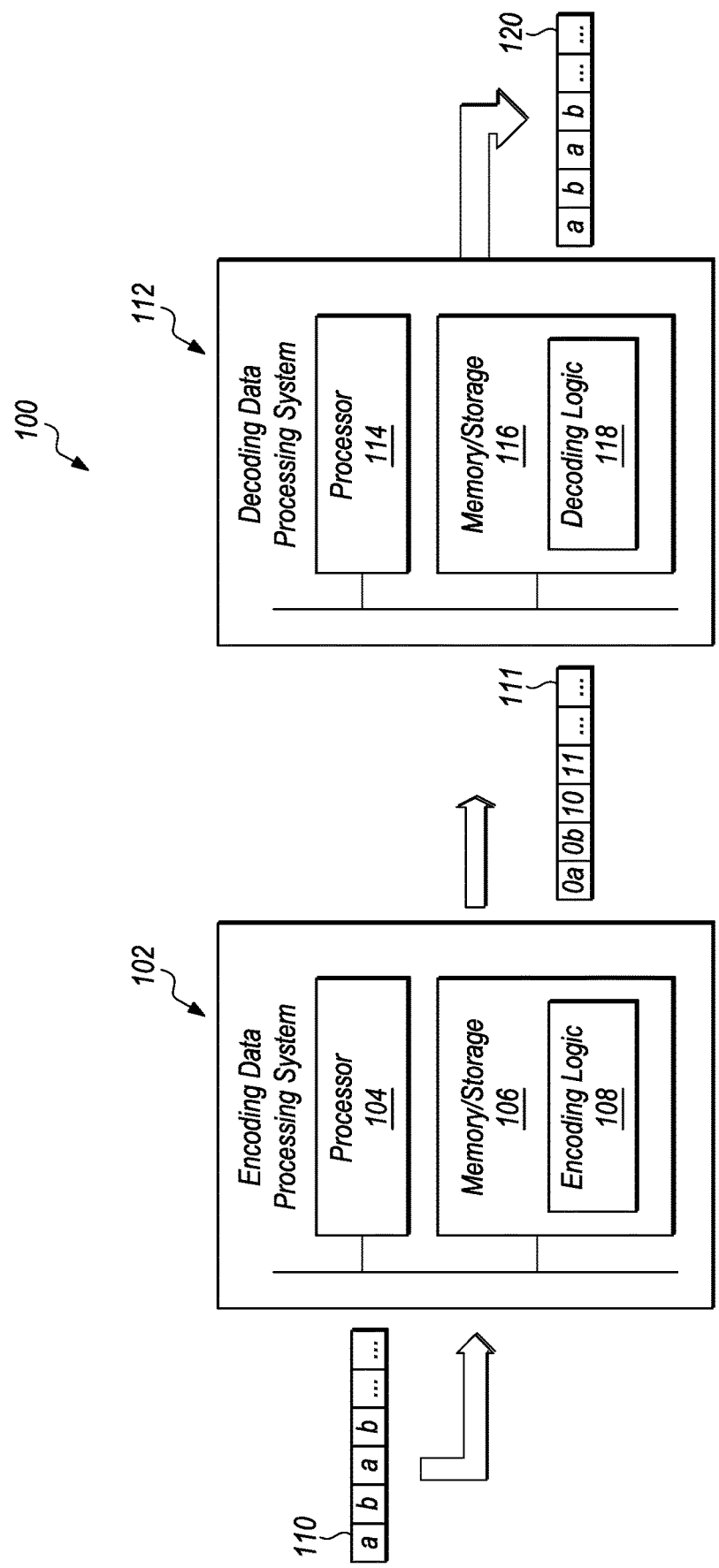
FIG. 1 illustrates a dynamic data compression system in accordance with an example of the present disclosure.

FIG. 1 illustrates dynamic data compression system 100 in accordance with an example of the present disclosure.

As shown in FIG. 1, among other components, dynamic data compression system 100 includes both an encoding data processing system 102 as well as a corresponding decoding data processing system 112. Here, as implied by its name, encoding data processing system 102 is configured to receive a specified context, as an input data stream, then parse and encode the input data stream into a plurality of output data symbols 111. Here, output data symbols 111 are code words that are smaller than the original representation of the input data stream as will be further described with reference to the figures below.

Encoding data processing system 102 includes a processor 104 as well as memory/storage 106. Memory/storage 106 includes an encoding logic 108. Although encoding logic 108 has been shown within memory/storage 106, one skilled in the art would realize that encoding logic 108 may be separate and apart from memory/storage and might be part of an ASIC (application specific integrated circuit) or the like for example.

An example input data stream 110, the corresponding encoded output data symbols 1111, and the recovered original data stream 120 are shown in FIG. 1. For example, input data stream 110 might be a text file. The text file might represent alphabets, numbers or literals for remote transmission. Although not shown, input data stream 110 might be other data types as well.

Encoding data processing system 102 takes input data stream 110, and compresses it using dictionary indices from a short dictionary. Specifically, in conjunction with processor 104, encoding logic 108 uses short dictionary indices for encoding input data stream 110. In one example, the dictionary size might be a 1-bit dictionary. As another example, the dictionary size might be a 5-bit dictionary. As a further example, the dictionary size might be a power of 2.

After compression, encoding data processing system 102 transmits or stores encoded output data stream 111 for decompression. At the receiving end, decoding data processing system 112 decompresses the data by dynamically generating the same dictionary that was used for encoding. In conjunction with processor 114, decoding logic 118 of memory/storage 116, receives and decodes the encoded output data stream 111 to recover the original data. An example of the recovered original data stream 120 is shown.

Figure 2:
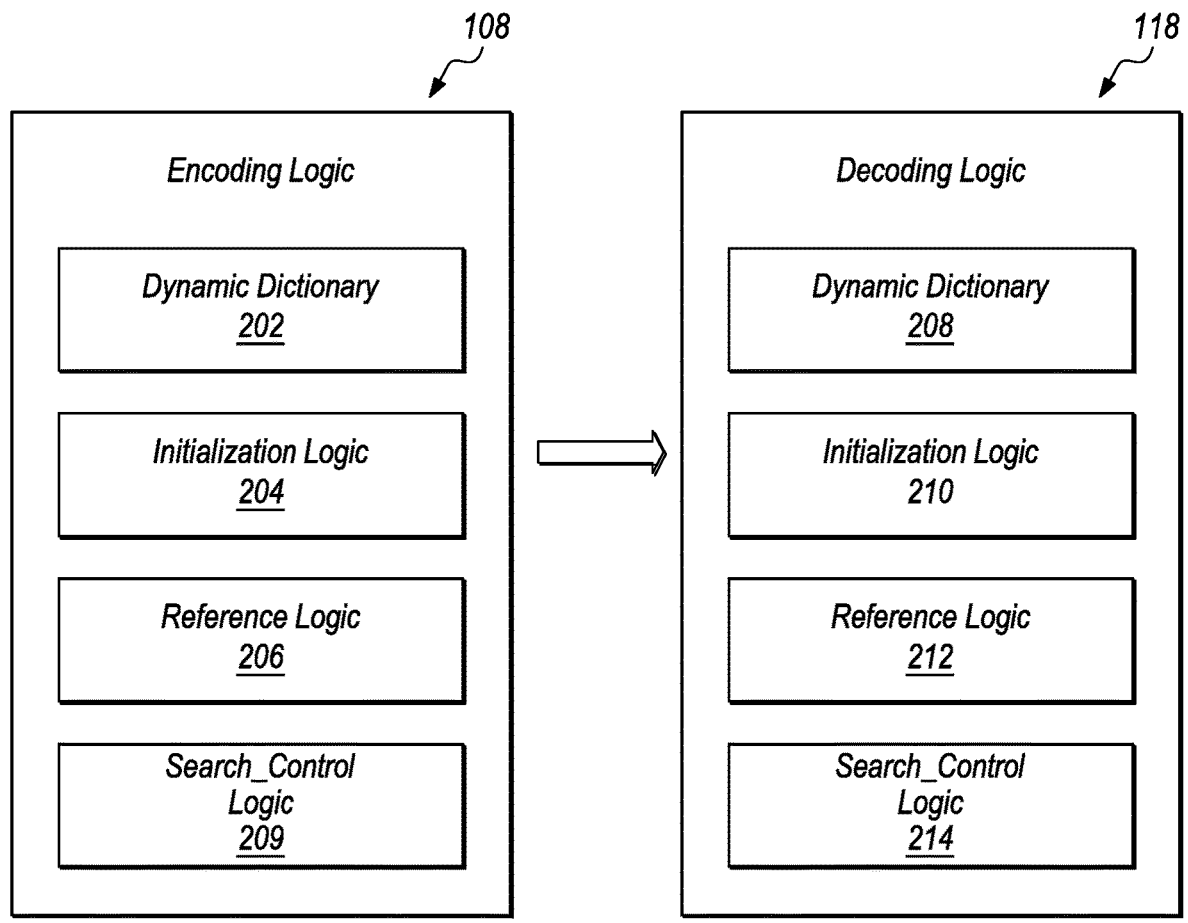
FIG. 2 illustrates an example of the encoding logic of FIG. 1.

FIG. 2 illustrates an example of encoding logic 108 of FIG. 1.

Among other components, encoding logic 108 includes a dynamic dictionary 202 as well as initialization logic 204. Although not shown, dynamic dictionary 202 might be part of a corresponding encoding table. Dynamic dictionary 202 is maintained in cache memory to store and track literals or symbols that are utilized. Thus, dynamic dictionary 202 maintains the entire space of encodable literals. Specifically, as further illustrated in FIG. 3A, dynamic dictionary 202 might include evictable dictionary entries.

Such evictable dictionary entries define the entire space of encodable literals. For example, for a 1-bit dictionary, only two evictable dictionary entries are stored in the dictionary. Moreover, such evictable dictionary entries are also evictable when specific threshold requirements are met. Upon meeting the threshold requirements, the evictable dictionary entries are replaced with an evictable dictionary entry that is itself distinct from other dictionary entries.

In FIG. 2, initialization logic 204 as implied by its name is configured to initialize and define the size of dynamic dictionary 202. In one implementation, initialization logic 204 sets the dictionary size to one bit. Initialization logic 204 might also map evictable dictionary entries to dictionary indices and vice versa as well as initialize dictionary pointers such as dictionary pointer 318 (FIG. 3A) for example.

As shown in FIG. 2, encoding logic 108 (FIG. 1) further comprises a reference logic 206 and search_control logic 209. Reference logic 206 is configured to perform referencing and updating for dynamic dictionary 208. Reference logic 206 stores new evictable dictionary entries in dynamic dictionary 202. In addition, as further discussed with reference to FIG. 3A, each evictable dictionary entry is associated with a reference count that tracks and counts the number of times that a particular input symbol is encoded. Reference logic 206 facilitates this referencing functionality. Reference logic 206 may then evict an evictable dictionary entry when the required conditions for eviction are met.

Search_control logic 209 is configured to receive input symbols from input data stream 110 and select the first symbol from the input data stream and search dynamic dictionary 202 to determine whether the first (and subsequent symbols) of the input data stream is stored in dynamic dictionary 202. Search_control logic 209 also provides control logic between initialization logic 204, reference logic 206 and dynamic dictionary 202.

In FIG. 2, among other components, decoding logic 118 includes a dynamic dictionary 208, initialization logic 210, reference logic 212 and search_control logic 214. Like the dynamic dictionary 202 which is generated during encoding, dynamic dictionary 208 is also dynamically generated during the decoding. Thus, dynamic dictionary 202 is not saved and transmitted with the encoded output data symbols, unlike traditional systems that store and forward dictionaries to enable decoding of the encoded data symbols. Rather, dynamic dictionary 208 is generated during decoding to replicate the same content as dynamic dictionary 202. Initialization logic 210, reference logic 212 and search_control logic 214 can perform functions similar to those described with reference to encoding logic 108.

Figure 3A:
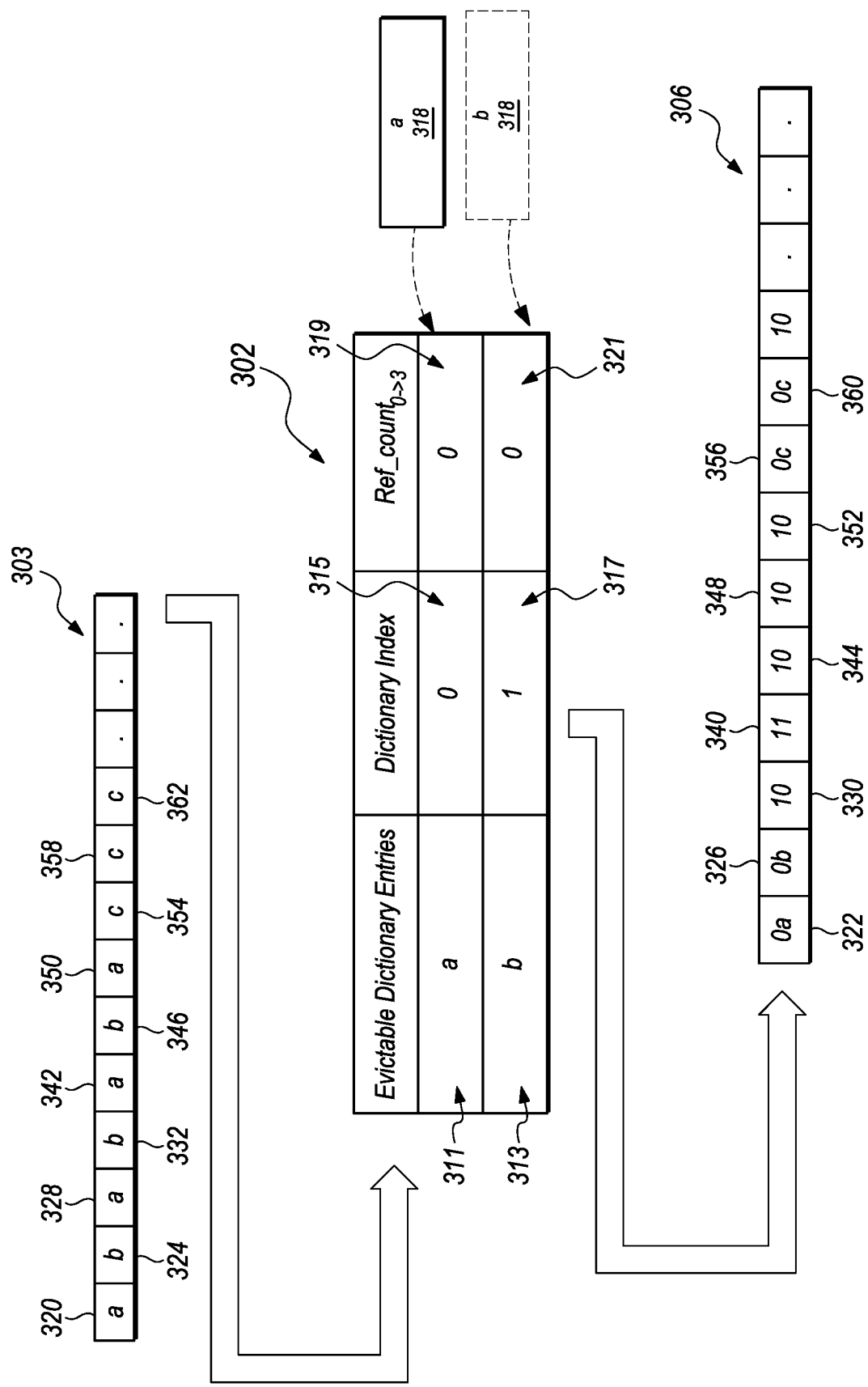
FIG. 3A illustrates a dynamic dictionary in accordance with an example of the present disclosure.

FIG. 3A illustrates dynamic dictionary 302 which is an example of dynamic dictionary 202 of FIG. 2 in accordance with the present disclosure.

In the example of FIG. 3A, dynamic dictionary 302 is a 1-bit dictionary of size two. That is, dynamic dictionary 302 is configured to store two evictable dictionary entries 311 and 313. Each evictable dictionary entry 311 and 313 is uniquely representable by a dictionary index 0 (shown at 315) and 1 (shown at 317), respectively.

Dynamic dictionary 302 is dynamically generated during the encoding operation. And for the entirety of encoding, this 1-bit dictionary remains in cache memory to facilitate rapid symbol encoding. The 1-bit dictionary then defines the size of literals that can be encoded. Since the traditional literal is encodable by 8 ASCII bits, dynamic dictionary 302 uses a smaller representation for received input symbols. Dynamic dictionary 302 is also dynamically built along with the compression/decompression process and therefore does not carry any overhead. In other words, the dictionary need not be saved along with the encoded output data stream for decompression.

As shown in FIG. 3A, dynamic dictionary 302 further includes two dictionary reference counts, namely ref_count 319 that is associated with evictable dictionary entry 311, and ref_count 321 associated with evictable dictionary entry 313. In one implementation, the dictionary reference counts may track and count the number of times that a particular input data symbol is encoded. The dictionary reference count is first initialized to a minimum threshold value (such as zero) and is then increased by one (1) whenever the evictable dictionary entry is encoded with its corresponding dictionary index.

Dynamic dictionary 302 is also associated with dictionary pointer 318 that is a cyclic pointer which rotates between all of the evictable dictionary entries. Initially, dictionary pointer 318 is initialized to 0 and points to a first dictionary entry of dynamic dictionary 302.

In use, compression is initiated when encoding data processing system 102 (FIG. 1) receives input data stream 303. Those of ordinary skill in the art will realize that that input data stream 303 is exemplary and is for illustration purposes. Here upon receiving input data stream 303, search_control logic 209 (FIG. 2) parses the input data and extracts the first symbol "a" (shown at 320) from input data stream 303. The input data stream 303 might be a text file. However, one skilled in the art will realize that other comparable data sources may be utilized.

Search_control logic 209 issues a "compare" instruction that compares the content of dynamic dictionary 302 and symbol "a" to determine whether symbol "a" is stored in dynamic dictionary 302. Since dynamic dictionary 302 is initially empty, symbol "a" is not found and a null is therefore returned.

Next, symbol "a" is stored as the first entry of dynamic dictionary 302 as shown at 311. Specifically, symbol "a" becomes the first evictable dictionary entry that is stored in one of two empty locations of dynamic dictionary 302.

Next, the stored evictable dictionary entry "a" is set to dictionary index "0" as shown at 315. Contemporaneously or thereafter, the corresponding reference count ref_count 319 for entry "a" is initialized to zero, that is, ref_count 319=0. It is noted that reference count ref_count 319 may be incremented by one each time that the same symbol is encoded with its dictionary index. After initialization of the reference count, dictionary pointer 318 cycles to the next dictionary entry.

Next, encoding logic 108 (FIG. 1) outputs the unencoded symbol "a." Specifically, because input symbol "a" was not found in dynamic dictionary 302, encoding logic 108 outputs symbol "a" onto output data stream 306 without encoding as shown at 322. Symbol "a" is output as a regular plain symbol without encoding.

Moreover, as shown at 322 of output data stream 306, an indicator bit 0 also precedes the unencoded symbol "a." This indicator bit 0 specifies that the output symbol "a" is unencoded. Therefore, when decompression occurs, the decoding data processing system 112 (of FIG. 1) can recognize the symbol "a" as unencoded and can output the symbol "a" without decompression.

Next, the second symbol of input data stream 303 is "b" as shown as 324. Here, dynamic dictionary 302 is half full with a single remaining storage location that is empty. Again, the content of dynamic dictionary 302 is searched for symbol "b." A null is returned because symbol "b" was not previously stored. The symbol "b" is saved into the single remaining storage location of dynamic dictionary 302 as shown at 313.

Dynamic dictionary 302 is now full because the two memory storage locations specifiable by 0 or 1 are full. Next, symbol "b" is also output without encoding, and is similarly preceded by an indicator bit 0 as shown at 326. The corresponding reference count 321 is then initialized to a zero value (and may later be incremented by one each time the same symbol is encoded with its dictionary index). Thus, for the first input symbol "b," ref_count 321=0 as shown in FIG. 3A. Here, dictionary pointer 318 then rotates to the next dictionary entry (indicated by 311).

The next symbol in input data stream 303 is a second symbol "a" shown at 328. Here, a search of cache memory reveals that symbol "a" was previously stored. Thus, this stored entry is merely referenced and the reference count ref_count 319 is increased from 0 to 1. Therefore, for the second input symbol "a," ref_count 319=1. Unlike prior art systems that require two passes—namely a first pass to collect symbol frequency statistics and a second pass for encoding—the present disclosure utilizes no more than a single pass because symbol frequency is tracked by employing one or more reference counts such as ref_count 319 and ref_count 321. Those of ordinary skill in the art will recognize that this single-pass feature significantly facilitates fast encoding of input data symbols.

Figure 3B:
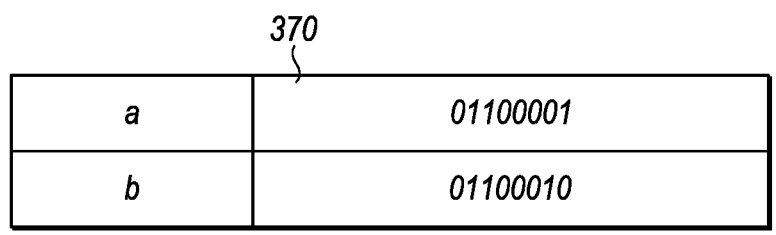
FIG. 3B is a conventional representation of symbol "a" and symbol "b."

The next step then outputs the encoded word. Here, unlike the first symbol "a" that was output without encoding, dynamic dictionary 302 outputs the second symbol "a" by encoding it with its corresponding dictionary index "0" shown at 315. That is, symbol "a" is output as an encoded symbol "0". Thus, symbol "a" is encoded with a one-bit symbol which is much shorter than the original ASCII representation of symbol "a" which is 01100001 at 370 of FIG. 3B. As shown at 330 of output data stream 306, an indicator bit 1 is placed immediately before symbol "0," the encoded symbol for "a." This indicator bit 1 denotes that the output symbol "a" is encoded. Therefore, when decoding later occurs, the symbol "a" is recognized as an encoded symbol that requires decompression.

One skilled in the art would recognize that this feature uses encoded and unencoded symbols such that dynamic dictionary sizes can remain small for faster processing. Moreover, the present disclosure uses dictionary indices to directly represent input data symbols where the dictionary indices are shorter than the original representation of the input data symbols.

The corresponding reference count ref_count 319 for evictable dictionary entry "a" is then incremented by one because the same evictable dictionary entry symbol "a" is encoded with its dictionary index "0." That is, ref_count 319=0. Dictionary pointer 318 then rotates to the next evictable dictionary entry.

The next symbol in output data stream 306 is a second symbol "b" shown at 332. Here, a search of cache memory reveals that symbol "b" was previously stored. This stored entry is then referenced, and reference count ref_count 321 is increased from 0 to 1. Thus, for the second input symbol "b," ref_count 321=1. The next step then outputs the encoded word. Here, unlike the second symbol "b" that was output without encoding, dynamic dictionary 302 outputs the second symbol "b" by encoding it with its corresponding dictionary index "1." That is, symbol "a" is output as an encoded symbol "1" as shown at 340 of output data stream 306. As can be seen, an indicator bit 1 appears immediately before the encoded symbol "1." This indicator bit 1 denotes that the output symbol "1" is encoded. Therefore, when decoding later occurs, the symbol "1" is recognized as an encoded symbol that requires decompression.

The associated reference count ref_count 321 is then incremented by one. And for the second input symbol "b," ref_count 321=1. Dictionary pointer 318 then rotates to the next evictable dictionary entry.

The next input symbol is a third symbol "a" shown at 342 which is output as "10" as shown at 344 of output data stream 306 with a reference count ref_count 319=2. The next input symbol is a third symbol "b" shown at 346 which is output as "10" as shown at 348 of output data stream 306 with a reference count ref_count 321=2. The description for the third symbols "a" and "b" is similar to the above and is skipped for brevity.

The next input symbol is a fourth symbol "a" shown at 350 which is output as "10" as shown at 352 of output data stream 306. Dictionary pointer 318 rotates to the next dictionary entry. However, the associated reference count ref_count 319, when incremented by one, reaches a maximum allowable threshold of 3. That is, for the fourth input symbol "a," ref_count 319=3. In this example, the maximum threshold value to which a reference count can be incremented is three. Those skilled in the art will realize that this threshold may be increased or decreased as proves necessary. For example, this threshold may be two. As another example, this threshold might be six.

Once a maximum threshold value is reached, the reference counts are no longer incremented for additional repetitive input symbols encountered in input data stream 303. This maximum threshold value accomplishes a two-fold functionality. First, it prevents overflow that can occur for innumerable repetitive symbols. Second, it facilitates eviction of dictionary entries within shorter cycles because reference counts are decremented when this maximum threshold level is reached. However, reference counts are decremented provided that the following conditions are met: 1) an input symbol and an evictable dictionary entry are not the same; 2) the dictionary pointer (318) is at the current dictionary entry; and 3) the associated reference count is greater than the minimum threshold value.

The next input symbol is "c" shown at 354, which is output as "0c" as shown at 356 of output data stream 306. In other words, symbol "c" is not an evictable dictionary entry, so it is output as a regular and unencoded symbol. In addition, input symbol "c" is distinct (different) from the existing evictable dictionary entries 'a' and "b." Therefore, reference count ref_count 321=2, is decreased by one so that: ref_count 321=1. Note that dictionary pointer 318 is also at the current location.

The next input symbol is a second "c" shown at 358 which is output as "0c" as shown at 360 of output data stream 306. The next input symbol is a third "c" shown at 362. Here, the evictable dictionary entry currently stored is "b." Dictionary pointer 318 is also pointing to "b." Reference count ref_count 321 is also pointing to "b." Reference count ref_count 321=1. Thus, because input symbol "c" is distinct, ref_count 321 is reduced by one so that ref_count 321=0. In accordance with examples of the present disclosure, once a reference count for an evictable dictionary entry reaches zero (or a defined minimum threshold), that evictable dictionary entry is replaced by the new input symbol. Here, evictable dictionary entry "b" is evicted and replaced with symbol "c" which is now evictable. In this manner, evictable dictionary entries are stored and then evicted when their reference count reaches a predetermined minimum threshold.

In this manner, the present disclosure utilizes a one-pass symbol compression employing a dynamic symbol dictionary. The present disclosure exploits symbol locality. Specifically, when a symbol is shown in a context, it is likely to show again in its neighborhood. Such symbol locality is exploited by building a dynamic symbol dictionary which is much smaller than (global) alphabet size. Thus, those repetitive symbols may be compressed using dictionary. Clearly, the new method does not entail symbol weights a priori.

This compression scheme also compresses near entropy while exhibiting much lower computational complexity and latency. This encoding scheme is also readily combined with the prevalent LZ77 encoding method or its variants into a composite one-pass encoding scheme to achieve superior performance. An example of an application of the present one-pass disclosure is for in-line compression which demands low latency and low CPU utilization. In addition, the use of a rotational pointer to evict an evictable pointed dictionary entry when its reference count is zero, is at a computational complexity of O(1). On the other hand, employing the least used entry might have a complexity of $O(2^d)$ wherein d denotes dictionary bits.

Referring now to FIGS. 1, 2 and 3A, decoding of output data stream 306 is similar to the encoding scheme. A dynamic dictionary is generated and evictable dictionary entries and corresponding dictionary indices are stored with said evictable dictionary entries being evicted and replaced with new symbols as proves necessary.

In FIG. 2, specifically, once decoding is initiated, decoding logic 118 (FIG. 1) receives output data stream 306 which includes both indicator bits 0 and 1. Referring now to FIG. 3A, at 322 of output data stream 306, the first bit "0" indicates that the symbol "a" following the first bit is unencoded. Therefore, symbol "a" is output as a regular symbol. Symbol "a" is also stored in dynamic dictionary 208 (dynamically generated) as a dictionary entry. At 326 of output data stream 306, the second bit "0" indicates that the symbol "b" following the second bit is unencoded. Therefore, symbol "b" is output as a regular symbol. Symbol "b" is also stored in dynamic dictionary 208 as a dictionary entry. At 330 of output data stream 306, the indicator bit "1" indicates that the symbol "0" that follows it is encoded. This process continues until the original input data stream 303 is recovered.

In this example implementation, the present dictionary-based data symbol encoding uses two bits (1-bit dictionary indicator plus 1-bit dictionary index) by using 1-bit dictionary. In traditional caching systems, a caching block might lie in a large space that is substantially beyond storage (e.g., a caching block of 64-bytes lies in a substantial space size of $2^{512}$) such that hashing must be employed to determine whether an incoming block exists in cache. In the present disclosure, symbols are defined in a small space, [0, 255] such that where an incoming symbol is located can be directly determined without hashing.

Figure 4:
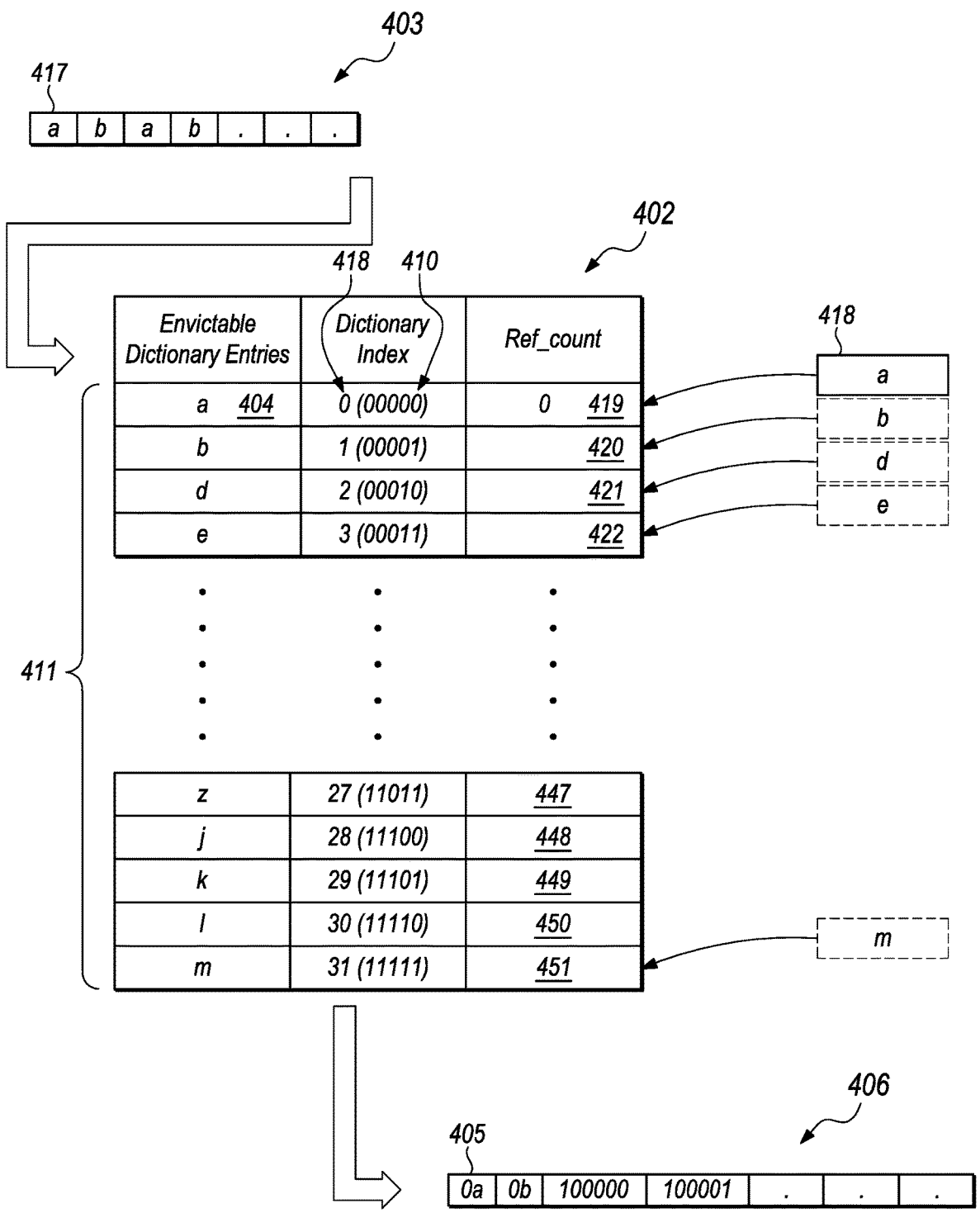
FIG. 4 illustrates another example of a dynamic dictionary in accordance with the present disclosure.

FIG. 4 illustrates another example of a dynamic dictionary 402 in accordance with the present disclosure.

In the example of FIG. 4, dynamic dictionary 402 is a 5-bit dictionary of size 32. In other words, dynamic dictionary 402 can store additional evictable dictionaries relative to the example of FIG. 3A. Specifically, dynamic dictionary 402 is configurable to store 32 evictable dictionary entries 411 as shown in FIG. 4. Evictable dictionary entries 411 are uniquely representable by dictionary indices 0 (shown at 418) through 31 (shown at 452), each index representable by five bits 410. As shown, dynamic dictionary 402 further includes 32 dictionary reference count, ref_count 419 through ref_count 451.

Dynamic dictionary 402 is also associated with dictionary pointer 418 that is a cyclic pointer which rotates between all of the evictable dictionary entries. Initially, dictionary pointer 418 is initialized to 0 and points to a first dictionary entry of dynamic dictionary 402. With each subsequent cycle, dictionary pointer 418 rotates to the next dictionary entry.

In use, dynamic dictionary 402 operates similarly as described with reference to dynamic dictionary 302 of FIG. 3A. For example, when a first input symbol "a" 417 of input data stream 403 is received, it is determined whether said first symbol "a" is stored in dynamic dictionary 402. Since dynamic dictionary 402 is empty (initially), first symbol "a" is not found and therefore stored as the first evictable dictionary entry of dynamic dictionary 402 as shown at 404. Further, since there are 32 referenced storage locations, 32 unique evictable dictionary entries can be stored as well as evicted.

Next, the stored evictable dictionary entry "a" 404 is set to dictionary index "0" (00000) as shown at 418. The reference count ref_count 419 for entry "a" is initialized to zero, that is, ref_count 419=0 and can be incremented to a maximum threshold value. Next, encoding logic 108 (FIG. 1) outputs the unencoded symbol "a." Specifically, because input symbol "a" was not found in dynamic dictionary 402, encoding logic 108 outputs symbol "a" on output data stream 406 without encoding and preceded by an indicator bit 0 as shown at 405."

Figure 5:
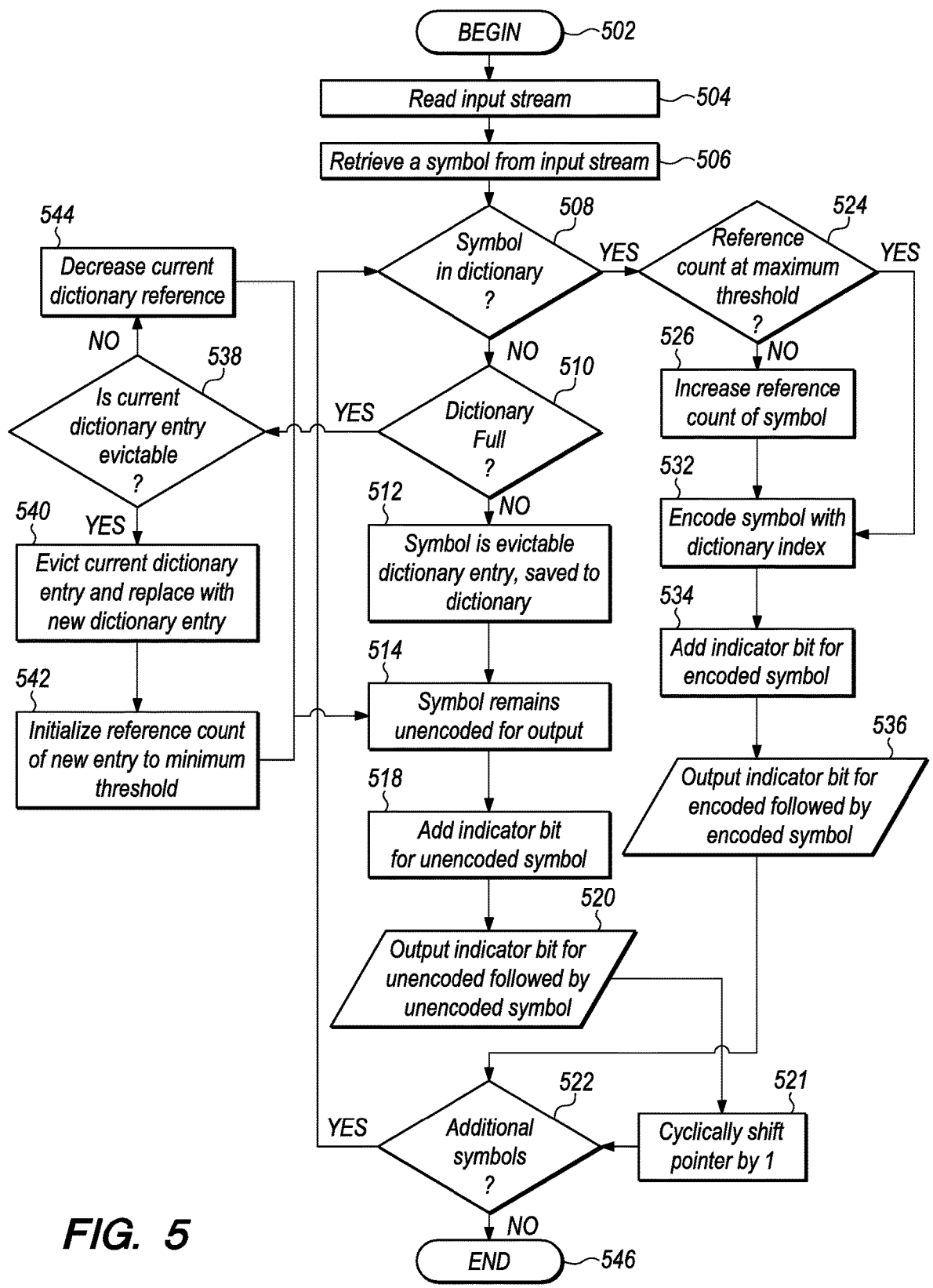
FIG. 5 illustrates an adaptive encoding method according to an example of the present disclosure.

FIG. 5 illustrates adaptive encoding method 500 according to an example of the present disclosure. For example, adaptive encoding method 500 might be implemented using dynamic data compression system 100 (FIG. 1).

At block 502, adaptive encoding method 500 is initiated. This block might involve initializing dictionary pointer 318 (FIG. 3A) and setting the size of the dynamic dictionary 302.

At block 504, adaptive encoding method 500 reads the input string. For example, the input string itself might be input data stream 303 (FIG. 3).

At block 506, adaptive encoding method 500 retrieves an input symbol from input data stream 303 (FIG. 3). Input data stream 303 is parsed and each symbol is retrieved sequentially one after the other.

At decision block 508, search_control logic 209 (FIG. 2) searches dynamic dictionary 302 (FIG. 3A) to determine whether the first input symbol is stored therein. If the first input symbol is stored, processing proceeds to decision block 524.

However, if the first input symbol is not stored in the dictionary, processing proceeds to decision block 510.

At decision block 510, it is determined whether dynamic dictionary 302 is full. If the dictionary is full, processing proceeds to block 538.

However, if dynamic dictionary 302 is not full, processing proceeds to block 512 where the first input symbol is stored in the dictionary as an evictable dictionary entry. Processing proceeds to block 514.

At block 514, the first symbol remains unencoded for output.

At block 518, an indicator bit is added before the first symbol prior to output onto an output data stream 306. The indicator symbol might be a "0" for example.

At block 520, the indicator bit followed by the unencoded symbol is output. The indicator bit denotes that the symbol is unencoded.

At block 521, method 500 cyclically shifts the pointer by 1. That is, for the cyclic shifter moves by 1 over each unsuccessful attempt for dictionary encoding.

At decision block 522, it is determined whether additional symbols exist in the input data stream. If there are no additional symbols, processing terminates at end block 546. If additional symbols exist, processing returns to decision block 508 where a search for the next symbol is conducted in dynamic dictionary 302 (FIG. 3).

If the next symbol is not in the dictionary, processing proceeds to decision block 510 through 512, 514, 516, 518, 520 and terminates at 546 as described above. If, however, the next symbol (or any prior symbol) is in dynamic dictionary 302 (FIG. 3), processing proceeds to decision block 524.

At decision block 524, it is determined whether the reference count associated with the next symbol is at the maximum threshold value. In one example, the maximum threshold value might be three. If the reference count (e.g. dictionary ref_count 319 (FIG. 3) is not at the maximum threshold value, processing proceeds to block 526.

At block 526, the reference count for the symbol is increased by one. At decision block 532, the symbol is encoded with a dictionary index.

At block 534, an indicator bit specifying that the symbol is encoded is placed before the encoded symbol.

At block 536, the output indicator bit (e.g., 1) is followed by the encoded symbol. The indicator and encoded word are then placed on the output data stream.

Processing proceeds to decision block 522, where it is determined whether additional symbols exist in the input data stream. If there are additional symbols, processing returns to decision block 508 as described above. If there are no additional symbols, processing terminates at block 546.

Returning to decision block 524, if the reference count is not at a maximum threshold value, processing simply proceeds to block 526.

At block 526, the reference count for the dictionary entry is increased by one.

At block 532, the symbol is encoded with the dictionary index.

At block 534, an indicator bit "1" is added before the encoded symbol.

At block 536, the output indicator bit followed by the encoded symbol is output onto the output data stream.

At decision block 522, it is determined whether additional symbols exist. If so, processing returns to decision block 508 as described above. Otherwise, processing terminates at end block 546.

Returning to decision block 524, if the reference count (for the evictable dictionary entry) is at a maximum threshold value, processing proceeds directly to block 532 where the symbol is encoded with the dictionary index. Here, the reference counter for the symbol is not increased. However, the symbol is nevertheless encoded with the associated dictionary index. Processing then proceeds via blocks 534, 536, 520 and terminates at 546 as described above.

Returning to decision block 538, it is determined whether the current dictionary entry is evictable. A current dictionary entry is evictable if its reference count is at the minimum threshold value and the dictionary pointer 318 (FIG. 3A) is at the current dictionary entry.

If the current dictionary entry is not evictable, processing proceeds to block 544. (However, if the current dictionary entry is evictable, processing proceeds to block 540).

At block 540, the encoding logic 108 (FIG. 1) then evicts the current dictionary entry and replaces it with a new dictionary entry from the input data stream.

At block 542, the reference count of the new symbol is initialized to a minimum threshold value. Processing then proceeds through blocks 514, 516, 518, 520 and terminates at 546 as described above.

Returning to decision block 538, if the current dictionary is not evictable, processing proceeds to block 544.

At block 544, encoding logic 108 (FIG. 1) decreases the current dictionary reference count and processing proceeds to blocks 514, 516, 518, 520 and terminates at 546 as described above.

Figure 6:
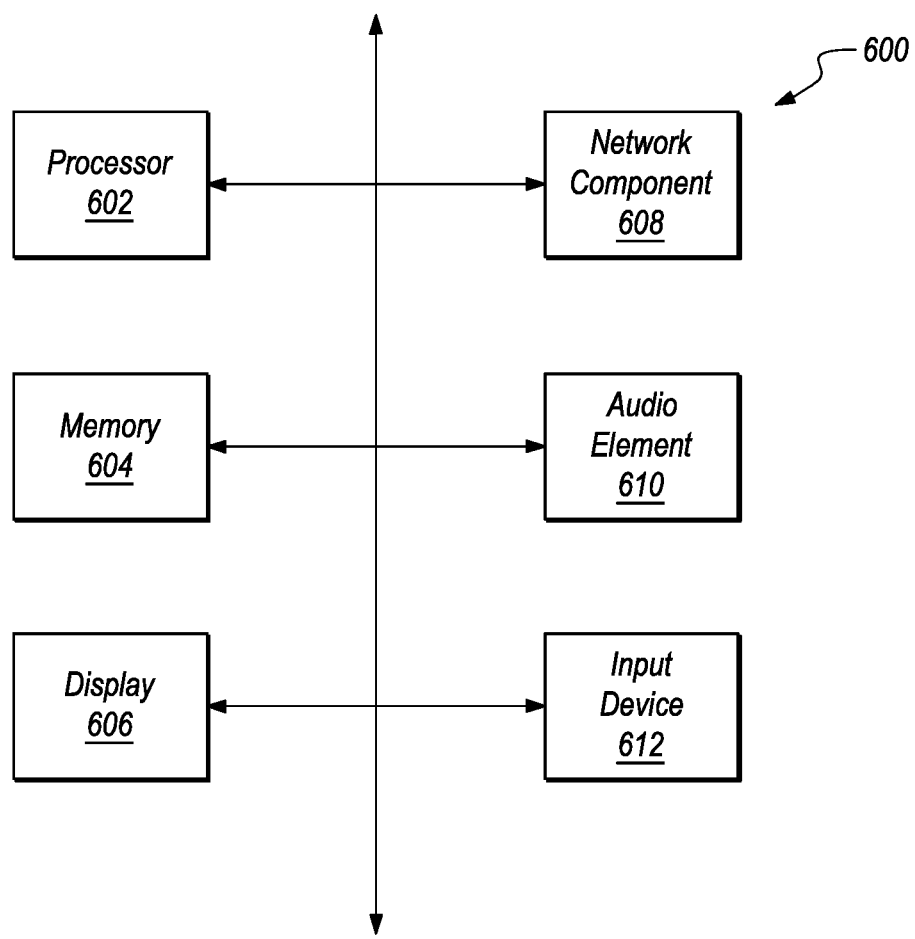
FIG. 6 illustrates one combination of a logical set of general components for an example computing device.

FIG. 6 illustrates one combination of a logical set of general components for a computing device usable in the present disclosure.

In this example, the device comprises a processor 602 for executing instructions that can be stored in a memory device or element 604. The device might include various memory types, data storage, or non-transitory computer-readable storage media such as a first data storage for program instructions for execution by processor 602, a separate storage for images or data, a removable memory for sharing information with other components, etc. The device may comprise display element 606, for example LCD (liquid crystal display) or touch screen although devices such as portable media players might convey information via other means such as through audio speakers.

The device in many embodiments might include at least one input device 612 that receives input signals from a user. This input element might be a push button, touch pad, touch screen, wheel, joystick, keyboard, mouse, keypad or any other such device or element through which a user can interact with or issue commands to the device. In some aspects, a device might exclude buttons and might be controlled only through visual and audio commands so that the user can control the device without contact with the input device. In other embodiments, the computing device can include one or more network interface elements 108 for communicating over various networks including Wi-Fi, Bluetooth, RF, wired, or wireless communication systems. The device in many embodiments can communicate with a network such as the Internet and may be able to communicate with other such devices. The example device can include one or more audio elements 610 as well such as one or more speakers for generating audio output and/or one or more microphones for receiving audio input such as voice commands from a user.

Figure 7:
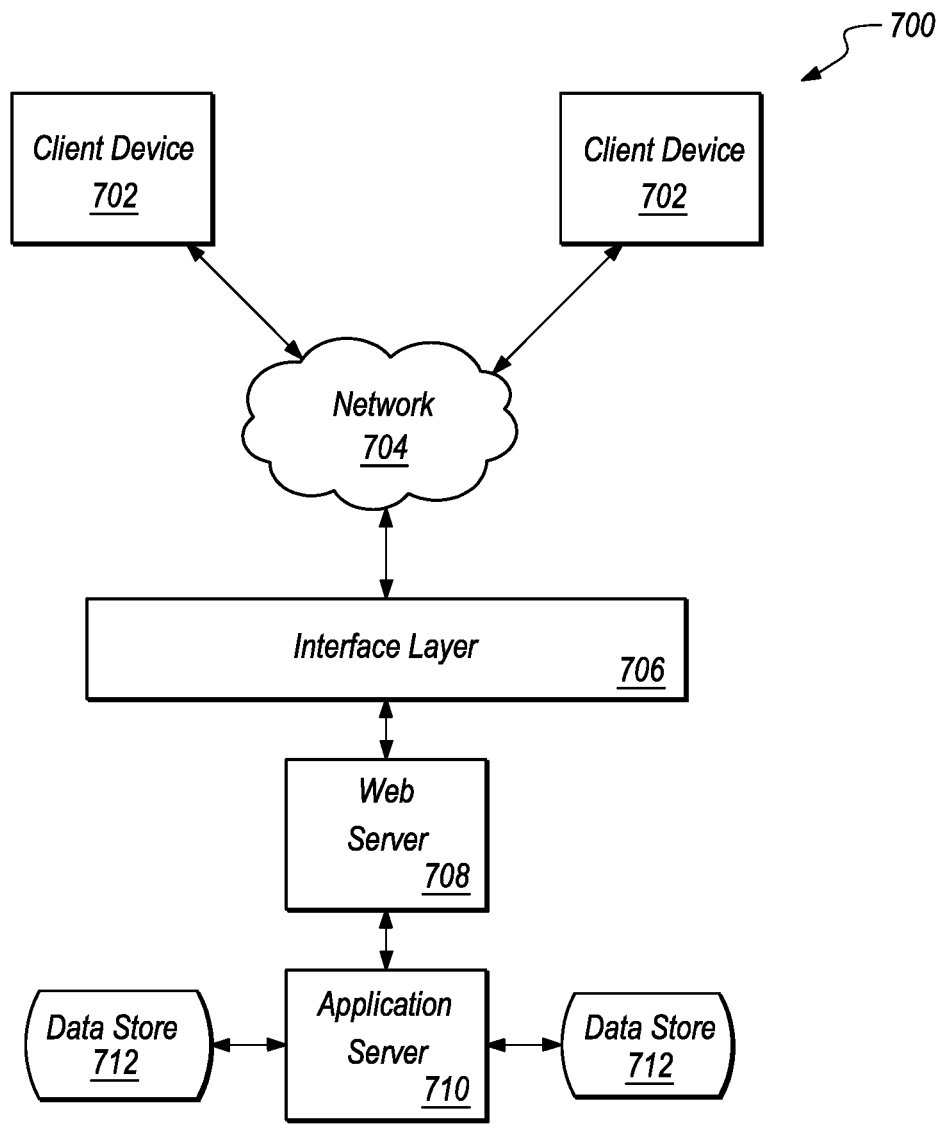
FIG. 7 illustrates an example of an environment in which various examples of the present disclosure can be implemented.

FIG. 7 illustrates an example of an environment 700 in which various embodiments of the present disclosure can be implemented.

Example environments discussed herein for implementing aspects in accordance with various embodiments are primarily Web-based as relate to Web services and cloud computing, but it should be appreciated that although a Web-based environment is used for purposes of explanation, different environments may be used as appropriate, to implement various embodiments. Client devices 702 employed with various embodiments can include any appropriate device operable to send and receive requests, messages, or information over at least one appropriate network 704 and convey information back to a user of the device.

Examples of such client devices include personal computers, smart phones, handheld messaging devices, laptop computers, set-top boxes, personal data assistants, electronic book readers and the like. The network can include any appropriate network including an intranet, the Internet, a cellular network, or any other such network or combination thereof. Components used for such a system can depend at least in part upon the types of network and/or environment selected. Protocols and components for communicating via such a network are well known and are omitted for brevity. Communication over the network can be enabled by wired or wireless connections and any combination thereof. In at least some embodiments, a request from the client device can be received to an interface layer 706 associated with a destination address of the request where the interface layer can include components such as routers, load balancers, application programming interfaces and the like. The interface layer can receive the request and direct information for the request to one or more computing resources such as one or more Web servers 708 and/or one or more application servers 710 which can process the request using data in one or more data stores or databases 712 in at least some embodiments. It should be understood that there can be several application servers, layers or other elements, processes, or components which may be chained or otherwise configured which can interact to perform tasks as discussed and suggested herein.

As used herein a data store refers to any device or combination of devices capable of storing, accessing and retrieving data which may include any combination and number of data servers, databases, data storage devices and data storage media in any standard distributed or clustered environment. The data store may be specially programmed to implement embodiments of the present disclosure thus making such implementation non-generic. A server can include any appropriate hardware and software for integrating with the data store as needed to execute aspects of the one or more applications for the client device handling a majority of the data access and business logic for an application.

The application server provides access control services in cooperation with the data store and is able to generate content such as text, graphics, audio, and/or video to be transferred to the user which may be serviced to the user by the Web server in the form of HTML, DHTML, XML or another appropriate structured language in the example. The handling of all requests and responses as well as the delivery of content between a client device and a resource can be handled by the Web server. It should be understood that the Web and application servers are not required and are merely example components as structured code discussed herein can be executed on any appropriate device or host machine as discussed elsewhere herein. Each server typically will include an operating system that provides executable program instructions for the general administration and operation of that server and typically will include non-transitory computer readable medium storing instructions that, when executed by a processor of the server, allow the server to perform its intended functions.

The servers may be specially programmed and implemented according to the embodiments of the present disclosure to make them non-generic. The environment in one embodiment is a distributed computing environment using several computer systems and components that are interconnected via communication links using one or more computer networks or direct connections. However, it will be appreciated by those skilled in the art that such a system could operate equally well in a system having a smaller or a greater number of components that are illustrated in FIG. 7. Thus, the depictions of various systems and services herein should be taken as being illustrative and not limiting.

While the above is a complete description of exemplary specific embodiments of the disclosure, additional embodiments are also possible. Thus, the above description should not be taken as limiting the scope of the disclosure which is defined by the appended claims along with their full scope of equivalents.

```
const int DictBits=5; //number of dictionary bits
struct Sym_Dict{
    int sym2Ind[256]={0}; //mapping from a valid symbol to
       dictionary index
//mapping from dictionary index to symbol, the lower 8 bits
are used for reference count
    int ind2Sym[1<<DictBits]={0xFF};
    int dictPtr=0; //dictionary pointer initialized to zero entry
} symDict;
Input: s; //s is an input symbol
If (0xFF==symDict.sym2Ind[s]){//s is new, then attempt to
save to dictionary
    Int *ind2SymPtr=& symDict.sym2Lit[symDict.dictPtr];
    If (0==(*ind2SymPtr &0xFF)) {//if not referenced the
       replace it.
    symDict.sym2Ind[*ind2SymPtr>>8]=0xFF; // evict out-
       dated symbol from dictionary
    ind2SymPtr=s<<8; // replaced by s with zero reference
       count
    symDict.sym2Ind[s]=symDict.dictPtr;
}
else {(*ind2SymPtr)--;}//decrease existing reference count,
while s is not save
//cyclically rotate the current dictionary pointer
symDict.dictPtr=(++symDict.dictPtr) & ((1<<DictBits)=1);
Output: s<<1^1; //output original symbol
}
else {// s exists in the dictionary, then refer to it
    int symInd=symDict.sym2Ind[s]; // dictionary index
    // increase reference count by 1 up to max 1<<3
    symDict.ind2Sym[symInd]+=!(symDict.ind2Sym[sy-
       mInd]>>2 &1);
    Output: symInd<<^0; // output dictionary index
}
```

I claim:

1. An encoding method comprising:
populating a dynamic dictionary data structure with a plurality of evictable dictionary entries based on input symbols of an input data stream, said evictable dictionary entries including first and second evictable dictionary entries;
encoding said evictable dictionary entries with a dictionary index that is shorter than an original representation of the of the input symbols;
maintaining a dynamic mapping table from the input symbols to dictionary index;
associating, with each one of said evictable dictionary entries, a reference count that is initialized to a predetermined minimum threshold wherein said reference count is increasable from the predetermined minimum threshold to the predetermined maximum threshold; and
using a cyclic pointer that rotates among said evictable dictionary entries to determine whether to replace a currently pointed dictionary entry,
wherein the reference count for the first evictable dictionary entry is reduced by one if: (1) an input symbol in the input data stream is distinct from all dictionary entries, (2) the cyclic pointer is at the first evictable dictionary entry, and (3) said reference count for the first evictable dictionary entry is greater than the predetermined minimum threshold.

2. The encoding method of claim 1 wherein the first evictable dictionary entry is eligible for eviction when its reference count is reduced to the predetermined minimum threshold.

3. The encoding method of claim 1 wherein the first evictable dictionary entry, upon eviction, is replaced by an input symbol from the input data stream that is distinct from the first and second evictable dictionary entries.

4. The encoding method of claim 1 further comprising outputting an encoded data stream wherein the encoded data stream includes an indicator bit followed by an output data symbol.

5. The encoding method of claim 4 wherein the indicator bit specifies that the output data symbol is unencoded.

6. The encoding method of claim 4 wherein the indicator bit specifies that the output data symbol is encoded.

7. The encoding method of claim 4 wherein the encoded data stream includes a first indicator bit and a second indicator bit wherein the first indicator bit specifies that the output data symbol is unencoded and the second indicator bit specifies that the output data symbol is encoded.

8. The encoding method of claim 1 wherein the dictionary size is a power of 2.

9. The encoding method of claim 1 wherein the dictionary is a 5-bit dictionary.

10. A non-transitory machine-readable storage media having instructions for performing an encoding method which causes a computing device to:
register, in a dynamic dictionary data structure, a plurality of evictable dictionary entries that are input symbols from an input data stream with said evictable dictionary entries including first and second evictable dictionary entries;
encode said evictable dictionary entries with a dictionary index that is shorter than an original representation of the input symbols;
associate, with each one of said evictable dictionary entries, a reference count that is initialized to a predetermined minimum threshold wherein said reference count is increasable from the predetermined minimum threshold to the predetermined maximum threshold; and
provide a cyclic pointer that rotates among said evictable dictionary entries to determine whether to replace a currently pointed dictionary entry,
wherein the reference count for the first evictable dictionary entry is reduced by one if: (1) an input symbol in the input data stream is different from all dictionary entries, (2) the cyclic pointer is at the first evictable dictionary entry, and (3) the reference count for the first evictable dictionary entry is greater than the predetermined minimum threshold.

11. The non-transitory machine-readable storage media of claim 10 wherein said predetermined minimum threshold is zero and said predetermined maximum threshold is three.

12. The non-transitory machine-readable storage media of claim 10 wherein said reference count for the first evictable dictionary entry is increased by one whenever the first evictable dictionary entry is encoded with its dictionary index.

13. The non-transitory machine-readable storage media of claim 10 wherein said reference count for said first evictable dictionary is increased by one until the predetermined maximum threshold is reached.

* * * * *